(12) United States Patent
Oda

(10) Patent No.: US 6,503,826 B1
(45) Date of Patent: Jan. 7, 2003

(54) SEMICONDUCTOR DEVICE AND METHOD FOR MANUFACTURING THE SAME

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/527,212

(22) Filed: Mar. 16, 2000

Related U.S. Application Data

(62) Division of application No. 09/190,826, filed on Nov. 12, 1998.

(30) Foreign Application Priority Data

Nov. 12, 1997 (JP) .............................. 9-310662

(51) Int. Cl.⁷ .......................................... H01L 21/4763
(52) U.S. Cl. ..................................... 438/624; 438/618
(58) Field of Search ................................ 438/301, 618, 438/624

(56) References Cited

U.S. PATENT DOCUMENTS

| | | | |
|---|---|---|---|
| 5,324,974 A | | 6/1994 | Liao |
| 5,384,288 A | * | 1/1995 | Ying |
| 5,406,115 A | | 4/1995 | Maeda et al. |
| 5,424,570 A | | 6/1995 | Sardella et al. |
| 5,512,513 A | * | 4/1996 | Machinda et al. |
| 5,552,628 A | * | 9/1996 | Watanabe et al. |
| 5,786,638 A | | 7/1998 | Yamaha |
| 5,793,110 A | | 8/1998 | Yamaha et al. |
| 5,913,140 A | * | 6/1999 | Roche et al. |
| 5,936,300 A | | 8/1999 | Sasada et al. |
| 6,071,184 A | * | 6/2000 | Mehta et al. |

FOREIGN PATENT DOCUMENTS

| | | |
|---|---|---|
| JP | 4-186675 | 7/1992 |
| JP | 6-188239 | 7/1994 |

OTHER PUBLICATIONS

M.T. Takagi et al., "Characterization of Hot–Carrier–Induced Degradation of MOSFETs Enhanced by $H_2O$ Diffusion for Multilevel Interconnection Processing", pp. 28.4.1–28.4.4, IEDM, 1992.

K. H. Keusters et al., "Self Aligned Bitline Contact for 4 MBIT Dram", pp. 640–649, ULSI Science and Techn., 1987.

* cited by examiner

Primary Examiner—John F. Niebling
Assistant Examiner—Stanetta Isaac
(74) Attorney, Agent, or Firm—Young & Thompson

(57) ABSTRACT

In an LDD structure MOSFET, a protecting multilayer insulating film is formed to cover a gate electrode in order to protect the gate electrode and the gate oxide film from a moisture included in an upper level layer. The protecting multilayer insulating film includes a protecting nitride film for preventing infiltration of moisture, and another protecting insulator film having a compressive stress for relaxing a tensile stress of the protecting nitride film. Thus, it is possible to prevent infiltration of moisture, and simultaneously, it is possible to minimize energy levels for trapping electrons and holes, which would have otherwise been formed within the gate oxide film and at a boundary between the gate oxide film and the semiconductor substrate because of the tensile stress of the protecting nitride film.

9 Claims, 4 Drawing Sheets

SEMICONDUCTOR DEVICE AND METHOD FOR MANUFACTURING THE SAME

CROSS-REFERENCE TO RELATED APPLICATIONS

This application is a division of copending application Ser. No. 09/190,826, filed Nov. 12, 1998.

BACKGROUND OF THE INVENTION

1. Field of the Invention

The present invention relates to a semiconductor device and a method for manufacturing the same, and more specifically to a MOS semiconductor device of a multilevel interconnection having a LDD (lightly doped drain) structure, and a method for manufacturing the same.

2. Description of Related Art

In a MOS semiconductor integrated circuit, an increase in the memory capacity of a DRAM, a system on silicon, a microminiaturization of transistor cell size, and a multilevel interconnection are advanced ceaselessly. As a result, the microminiaturization and the multilevel interconnection have been surely advanced, however, it becomes more difficult to ensure reliability of circuit elements including transistors. In particular, a threshold of a MOSFET (metal-oxide-semiconductor field effect transistor) having the LDD structure and the multilevel interconnection is greatly influenced by infiltration of moisture from a plurality of interlayer films stacked on a gate electrode of the transistor because it has the multilevel interconnection.

In order to prevent the infiltration of moisture from the interlayer films, a MOSFET semiconductor device of the LDD structure as shown in FIG. 4C has been known. Now, a method for manufacturing this semiconductor device will be described with reference to FIGS. 4A to 4C.

First, a field oxide film 2 for a device isolation is formed on a semiconductor substrate 1 of for example a P-type conductivity by using a LOCOS (local oxidation of silicon) process, and a gate oxide film 3 having a thickness of about 8 nm is formed on the semiconductor substrate 1 excluding the field oxide film 2, by use of a thermal oxidation. Thereafter, boron ions ($BF_2^+$) for adjusting the threshold voltage of the transistor, are ion-implanted through the gate oxide film 3 into a device. region of the semiconductor substrate 1 for example with an energy of 35 KeV and a dose of $4 \times 10^{12}/cm^2$. Furthermore, a polysilicon film having a thickness of about 300 nm is deposited on the gate oxide film 3 by means of a CVD (chemical vapor deposition) process, and a heat treatment is conducted within atmosphere of $PH_3$ or another so as to dope phosphorus into the polysilicon film. The phosphorus-doped polysilicon film is selectively removed by a photolithography to form a gate electrode 4. By using the gate electrode 4 as a mask, for example, phosphorus is ion-implanted with an energy of 20 KeV and a dose of $7 \times 10^{13}/cm^2$, so that $N^-$ diffused layers 5 are formed as a source and a drain. Then, a CVD oxide film 6 having a thickness of about 150 nm is deposited on a whole surface of the semiconductor substrate 1 including the gate electrode 4 by means of the CVD process. Thus, it becomes a structure shown in FIG. 4A.

Thereafter, as shown in FIG. 4B, the CVD oxide film 6 deposited on the whole surface of the semiconductor substrate 1 including the gate electrode 4 is anisotropically etched so that the CVD oxide film 6 remains only on a side wall of the gate electrode 4 so as to form a sidewall oxide film 7. By using the gate electrode 4 having the sidewall oxide film 7 as a mask, for example, arsenic is ion-implanted with an energy of 70 KeV and a dose of $3 \times 10^{15}/cm^2$. Furthermore, a heat treatment is conducted at 900° C. for 10 minutes so as to activate ions. Thus, $N^+$ diffused layers 8 are formed as a source lead-out electrode and a drain lead-out electrode. At this time, a principal portion of the LDD structure MOSFET is completed.

Succeedingly, in order to protect the above mentioned LDD structure MOSFET from contamination by various materials formed thereon, as shown in FIG. 4C, a first protecting silicon oxide film 9 having a thickness of about 100 nm is formed on the whole surface of the semiconductor substrate 1 including the gate electrode 4, by an atmospheric pressure CVD process with a raw gas of $SiH_4$ and $O_2$ and a substrate temperature of about 400° C. Furthermore, a first protecting silicon nitride film 10 having a thickness of 10 nm to 20 nm is formed on the first protecting oxide film 9 by a thermal CVD process with a raw as of $SiH_2Cl_2$ and $NH_3$, a substrate temperature of about 700° C. and a gas pressure of about 1 Torr.

Thereafter, a first interlayer BPSG (borophosphosilicate glass) film 11 is formed on the whole surface. For connection to devices including the LDD structure MOSFET, first through-holes (not shown) are formed for connection to the $N^+$ diffused layers as the source lead-out electrode and the drain lead-out electrode, and a first metal layer (not shown) (which can be formed of various metals) is deposited on the first interlayer BPSG film 11 to fill up the through-holes, and then is patterned to form a first level metal interconnection (not shown). Furthermore, a second interlayer film (not shown) is formed on the first level metal interconnection, and second through-holes (not shown) are formed, and a second level metal interconnection (not shown) is formed. These procedures are repeated, so that a multilevel interconnection structure is completed.

In the above mentioned prior art LDD structure MOSFET semiconductor device, variation of the threshold voltage caused by infiltration of moisture is prevented by covering the gate electrode with the first protecting nitride film 10 having a necessary thickness and a sufficient density for shutting out the infiltration of moisture contained for example in the BPSG film 11. Although the infiltration of moisture could be prevented by the first protecting nitride film 10, another problem has newly occurred. Namely, since the first protecting silicon nitride film 10, which has the thickness of 10 nm to 20 nm and covers the gate electrode 4 and which is dense enough to shut out the infiltration of moisture, has a tensile stress of about $1 \times 10^{10}$ dynes/$cm^3$, energy levels for trapping electrons and holes are easily formed within the gate oxide film 3 including the neighborhood of the drain and at a boundary between the gate oxide film and the semiconductor substrate 1, with the result that hot carriers accelerated by an electric field in the neighborhood of the drain are trapped in the trapping energy levels, and therefore, the threshold voltage varies.

SUMMARY OF THE INVENTION

Accordingly, it is an object of the present invention to provide a semiconductor device and a method for manufacturing the same, which has overcome the above mentioned defect of the conventional one.

Another object of the present invention is to provide a LDD structure MOSFET semiconductor device having a stable and reliable threshold voltage by preventing infiltration of moisture from interlayer insulator films such as interlayer BPSG films stacked on the gate electrode, and also by minimizing the density of energy levels for trapping electrons and holes, which are formed within the gate oxide film and at the boundary between the gate oxide film and the semiconductor substrate, and a method for manufacturing the same.

The above and other objects of the present invention are achieved in accordance with the present invention by a semiconductor device comprising a semiconductor substrate of a first conductivity type, a first insulator film formed on the semiconductor substrate for confining a device region, a gate insulator film formed on the semiconductor substrate including the first insulator film, a gate electrode formed on the gate insulator film within the device region, a source region and a drain region of a second conductivity type opposite to the first conductivity type, formed in the semiconductor substrate within the device region in self-alignment with the gate electrode, a sidewall insulator film formed on a side wall of the gate electrode, a source lead-out region and a drain lead-out region of the second conductivity type formed in the semiconductor substrate within the device region in self-alignment with the sidewall insulator film and the gate electrode, a protecting insulating film having at least one insulator film and formed on the whole surface of the semiconductor substrate including the gate electrode and the sidewall insulator film, and an interlayer insulator film formed on the whole surface of the semiconductor substrate including the protecting insulating film for isolating the gate electrode from a metal interconnection formed on the interlayer insulator film, the protecting insulating film having the nature of shutting out moisture from an upper interlayer insulator film including at least the interlayer insulator film and of minimizing a stress of the protecting insulating film.

In a first embodiment of the semiconductor device, the protecting insulating film is constituted of a multilayer film composed of a nitride film having the nature of shutting out infiltration of moisture and having a thickness of 10 nm to 20 nm and an oxide film having a compressive stress and having a thickness of 40 nm to 60 nm, which are deposited in the named order on the whole surface of the semiconductor substrate including the gate electrode and the sidewall insulator film.

In a second embodiment of the semiconductor device, the protecting insulating film is constituted of a multilayer film composed of a first oxide film having a thickness of 90 nm to 110 nm, a nitride film having the nature of shutting out infiltration of moisture and having a thickness of 10 nm to 20 nm and a second oxide film having a compressive stress and having a thickness of 40 nm to 60 nm, which are deposited in the named order on the whole surface of the semiconductor substrate including the gate electrode and the sidewall insulator film.

In a third embodiment of the semiconductor device, the protecting insulating film is constituted of a multilayer film composed of a first nitride film having the nature of shutting out infiltration of moisture and having a thickness of 10 nm to 20 nm and a second nitride film having a compressive stress and having a thickness of 30 nm to 100 nm, which are deposited in the named order on the whole surface of the semiconductor substrate including the gate electrode and the sidewall insulator film.

In a fourth embodiment of the semiconductor device, the protecting insulating film is constituted of a multilayer film composed of an oxide film having a thickness of 90 nm to 110 nm, a first nitride film having the nature of shutting out infiltration of moisture and having a thickness of 10 nm to 20 nm and a second nitride film having a compressive stress and having a thickness of 30 nm to 100 nm, which are deposited in the named order on the whole surface of the semiconductor substrate including the gate electrode and the sidewall insulator film.

According to another aspect of the present invention, there is provided a method for manufacturing a semiconductor device, comprising the steps of forming a first insulator film formed on a semiconductor substrate of a first conductivity type, for confining a device region, forming a gate insulator film on the semiconductor substrate including the first insulator film, forming a gate electrode on the gate insulator film within the device region, forming a source region and a drain region of a second conductivity type opposite to the first conductivity type, in the semiconductor substrate within the device region in self-alignment by using the gate electrode as a mask, forming a sidewall insulator film on a side wall of the gate electrode, forming a source lead-out region and a drain lead-out region of the second conductivity type in the semiconductor substrate within the device region in self-alignment by using the sidewall insulator film and the gate electrode as a mask, forming a protecting insulating film having at least one insulator film, on the whole surface of the semiconductor substrate including the gate electrode and the sidewall insulator film, and forming an interlayer insulator film formed on the whole surface of the semiconductor substrate including the protecting insulating film for isolating the gate electrode from a metal interconnection formed on the interlayer insulator film, wherein the step of forming the protecting insulating film forms a protecting insulator film having the nature of shutting out moisture from an upper interlayer insulator film including at least the interlayer insulator film and of minimizing a stress of the protecting insulating film.

In a first embodiment of the method for manufacturing a semiconductor device, the step of forming the protecting insulating film includes the step of depositing a nitride film having a thickness of 10 nm to 20 nm on the whole surface of the semiconductor substrate including the gate electrode and the sidewall insulator film by a thermal chemical vapor deposition process, and succeedingly depositing an oxide film having a thickness of 40 nm to 60 nm by a plasma chemical vapor deposition process.

In a second embodiment of the method for manufacturing a semiconductor devices the step of forming the protecting insulating film includes the step of depositing a first oxide film having a thickness of 90 nm to 110 nm on the whole surface of the semiconductor substrate including the gate electrode and the sidewall insulator film by an atmospheric pressure chemical vapor deposition process, succeedingly depositing a nitride film having a thickness of 10 nm to 20 nm by a thermal chemical vapor deposition process, and thereafter, depositing a second oxide film having a thickness of 40 nm to 60 nm by a plasma chemical vapor deposition process.

In a third embodiment of the method for manufacturing a semiconductor device, the step of depositing a first nitride film having a thickness of 10 nm to 20 nm by a thermal chemical vapor deposition process, and succeedingly depositing a second nitride film having a thickness of 30 nm to 100 nm by a plasma chemical vapor deposition process.

In a fourth embodiment of the method for manufacturing a semiconductor device, the step of forming the protecting insulating film includes the step of depositing an oxide film having a thickness of 90 nm to 110 nm on the whole surface of the semiconductor substrate including the gate electrode and the sidewall insulator film by an atmospheric pressure chemical vapor deposition process, succeedingly depositing a first nitride film having a thickness of 10 nm to 20 nm by a thermal chemical vapor deposition process, and thereafter, depositing a second nitride film having a thickness of 30 nm to 100 nm by a plasma chemical vapor deposition process.

In the above mentioned method for manufacturing a semiconductor device, preferably, the thermal chemical vapor deposition is conducted at a temperature of 700° C., the atmospheric pressure chemical vapor deposition process is conducted at a temperature of 400° C., and the plasma chemical vapor deposition process is conducted at a temperature range of 250° C. to 300° C.

In addition, preferably, before the first nitride film having the thickness of 10 nm to 20 nm is deposited by the thermal chemical vapor deposition process, the semiconductor substrate is heat-treated in a deposition machine for depositing the first nitride film, for not less than ten seconds at a temperature of not less than 700° C. and a gas pressure of not greater than $10^{-3}$ Torr.

The above and other objects, features and advantages of the present invention will be apparent from the following description of preferred embodiments of the invention with reference to the accompanying drawings.

DESCRIPTION OF THE PREFERRED EMBODIMENTS

Embodiments of the present invention will be described with reference to the accompanying drawings.

Figure 4A:
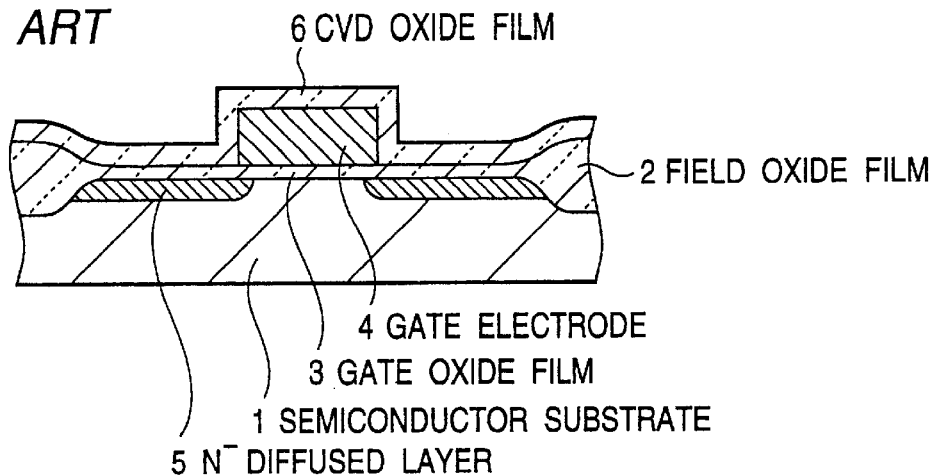
FIGS. 4A to 4C are diagrammatic sectional views of the semiconductor device for illustrating the prior art semiconductor device manufacturing method.

The semiconductor device manufacturing method in accordance with the first embodiment of the present invention is the same as the process explained with reference to FIGS. 4A and 4B until the sidewall oxide film 7 is formed in the prior art semiconductor device manufacturing method. Therefore, explanation of this same process will be omitted, and only further processing will be described.

Figure 1A:
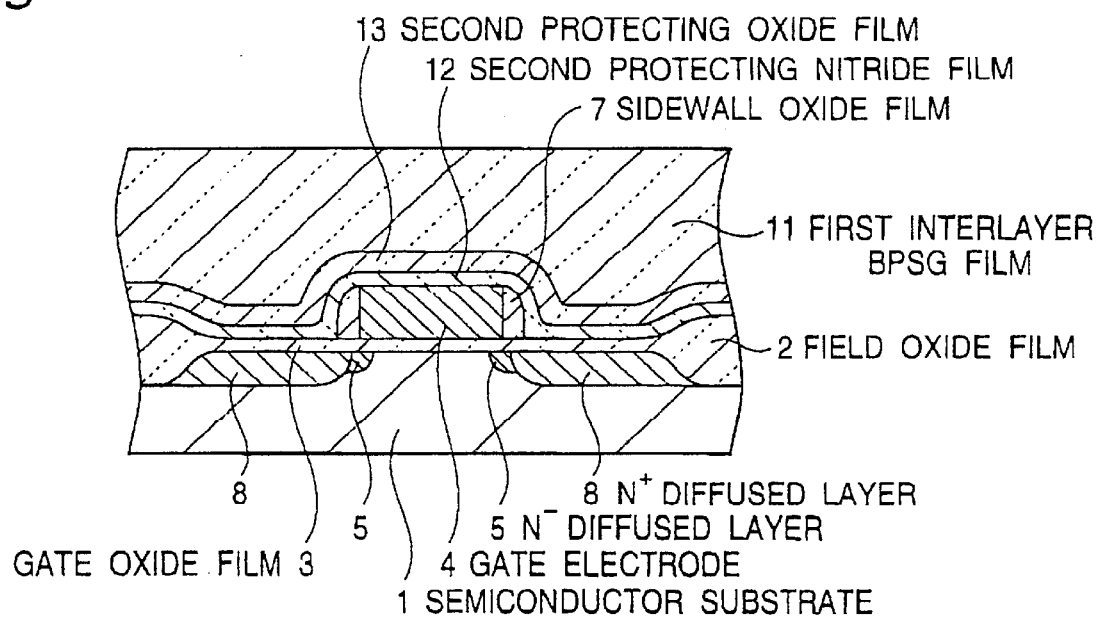
FIG. 1A is a diagrammatic sectional view of the semiconductor device for illustrating the semiconductor device and the semiconductor device manufacturing method in accordance with a first embodiment of the present invention.
Figure 4B:
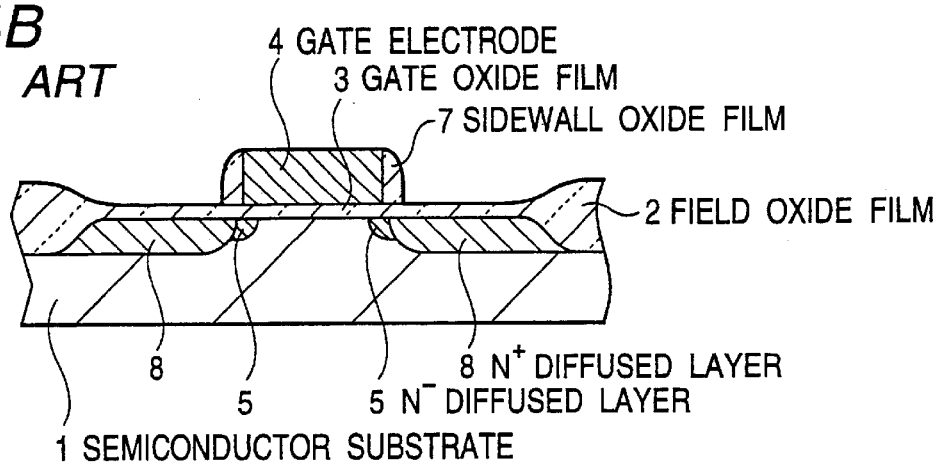
Figure 4C:
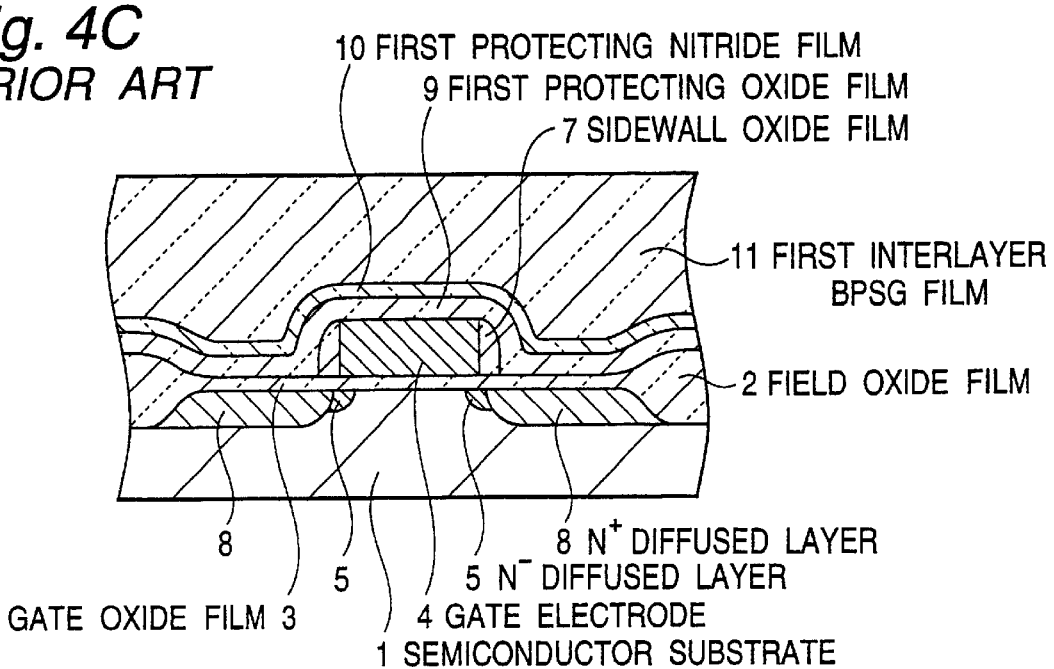

After a principal portion of the LDD structure MOSFET having the sidewall silicon oxide film 7 formed on the side wall of the gate electrode is completed as shown in FIG. 4B, in order to protect this LDD structure MOSFET from contamination by various materials formed thereon, as shown in FIG. 1A, a second protecting silicon nitride film 12 having a thickness of 10 nm to 20 nm is formed on the whole surface of the silicon semiconductor substrate 1 including the gate electrode 4, by a thermal CVD process with a raw gas of $SiH_2Cl_2$ and $NH_3$, a substrate temperature of about 700° C. and a gas pressure of about 1 Torr. Then, a second protecting silicon oxide film 13 having a thickness of about 50 nm is formed on the whole surface of the semiconductor substrate 1 including the second protecting nitride film 12, by a plasma CVD process with a raw gas of $SiH_4$ and $O_2$ under the condition that a gas pressure is about 5 Torr, a RF power is 100 W, and a RF frequency is 13.56 MHz. Succeedingly, a BPSG film having a thickness of about 1000 nm is deposited by an atmospheric pressure CVD process with a raw gas of $O_3$ and TEOS (tetraethoxysilane) and a substrate temperature of about 400° C.

The BPSG film is planarized by an etch-back process using an inorganic silica in order to remove a step formed because of the gate electrodes and others. Thus, a first interlayer BPSG film 11 having a thickness of about 800 nm and a planarized upper surface is formed.

Thereafter, similarly to the prior art semiconductor device manufacturing method, for connection to devices including the LDD structure MOSFET, first through-holes (not shown) are formed for connection to the $N^+$ diffused layers 8 as the source lead-out electrode and the drain lead-out electrode, and a first metal layer (not shown) (which can be formed of various metals) is deposited on the first interlayer BPSG film 11 to fill up the through-holes, and then is patterned to form a first level metal interconnection (not shown). Furthermore, a second interlayer film (not shown) is formed on the first level metal interconnection, and second through-holes (not shown) are formed, and a second level metal interconnection (not shown) is formed. These procedures are repeated, so that a multilevel interconnection structure is completed.

In this first embodiment of the present invention, as mentioned above, the second protecting nitride film 12 and the second protecting oxide film 13 are stacked in the named order to form a protecting multilayer insulating film covering the whole surface of the semiconductor substrate 1 including the gate electrode 4. Here, in order to shut out the infiltration of moisture, when the second protecting nitride film 12 is formed to have the thickness of 10 nm to 20 nm by the thermal CVD process with the raw gas of $SiH_2Cl_2$ and $NH_3$, the substrate temperature of about 700° C. and the gas pressure of about 1 Torr, the second protecting nitride film 12 has a tensile stress of about $1 \times 10^{10}$ dynes/cm$^3$. On the other hand, when the second protecting oxide film 13 is formed to have the thickness of about 50 nm, by the plasma CVD process with the raw gas of $SiH_4$ and $O_2$ under the condition that the gas pressure is about 5 Torr, the RF power is 100W, and the RF frequency is 13.56 MHz, the second protecting oxide film 13 has a compressive stress of $1 \times 10^9$ dynes/cm$^3$ to $1.5 \times 10^9$ dynes/cm$^3$. Therefore, the second protecting oxide film 13 acts to relax the tensile stress of the second protecting nitride film 12 by the compressive stress of the second protecting oxide film 13. In addition, since the compressive stress of the second protecting oxide film 13 can be freely changed by changing the RF power and/or the thickness, the second protecting oxide film 13 can optimize the stress of the protecting multilayer insulating film formed of the second protecting nitride film 12 and the second protecting oxide film 13.

By forming the second protecting oxide film 13 on the second protecting nitride film 12 as mentioned above, a first advantage can be obtained that it is possible to optimize the stress of the protecting insulating film, with the result that it is possible to minimize the density of energy levels for trapping electrons and holes within the gate oxide film 3, including the neighborhood of the drain, and at a boundary between the gate oxide film 3 and the semiconductor substrate 1.

A second advantage can also be obtained in which, by growing the second protecting nitride film 12 directly on the gate oxide film 3 and the gate electrode 4, it is possible to eliminate influence on transistors by moisture possibly contained iii the first protecting oxide film 9 of the prior art LDD structure MOSFET semiconductor device.

The semiconductor device manufacturing method in accordance with the second embodiment of the present invention is the same as the process until the sidewall oxide film 7 is formed in the prior art semiconductor device manufacturing method explained hereinbefore. Therefore, explanation of the same process will be omitted, and further processing. will be described with reference to FIG. 1B.

Figure 1B:
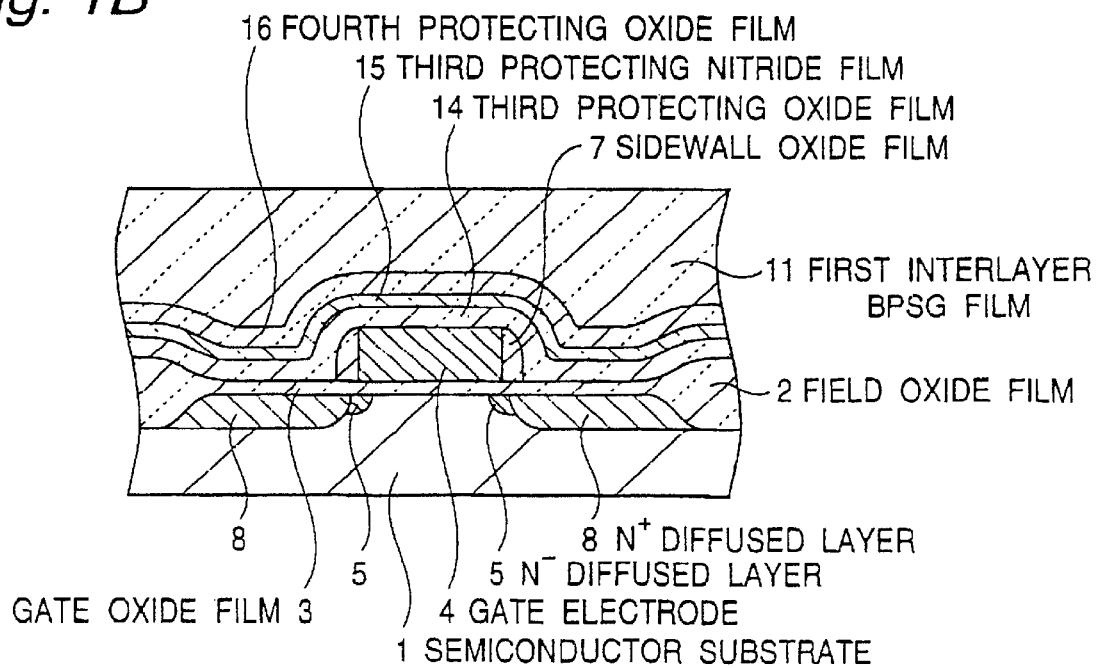
FIG. 1B is a diagrammatic sectional view of the semiconductor device for illustrating the semiconductor device and the semiconductor device manufacturing method in accordance with a second embodiment of the present invention.

After a principal portion of the LDD structure MOSFET having the sidewall oxide film 7 formed on the side wall of the gate electrode is completed as shown in FIG. 4B, in order to protect this LDD structure MOSFET from contamination by various materials formed thereon, as shown in FIG. 1B, a third protecting silicon oxide film 14 having a thickness of about 100 nm is formed on the whole surface of the semiconductor substrate 1 including the gate electrode 4, by an atmospheric pressure CVD process with a raw gas of $SiH_4$ and $O_2$ and a substrate temperature of about 400° C., and furthermore a third protecting silicon nitride film 15 having a thickness of 10 nm to 20 nm is formed by a thermal CVD process with a raw gas of $SiH_2Cl_2$ and $NH_3$, a substrate temperature of about 700° C. and a gas pressure of about 1 Torr. Then, a fourth protecting silicon oxide film 16 having a thickness of about 50 nm is formed on the whole surface of the semiconductor substrate 1 including the third protecting nitride film 15, by a plasma CVD process with a raw gas of $SiH_4$ and $O_2$ under the condition that a gas pressure is about 0.1 Torr, a RF power is 100W, and a RF frequency is 13.56 MHz. Thereafter, a process similar to the first embodiment is conducted, and multilevel interconnection structure having the LDD structure MOSFET is completed.

In this second embodiment of the present invention, as mentioned above, the third protecting oxide film 14, the third protecting nitride film 15 and the fourth protecting oxide film 16 are stacked in the named order to form a protecting multilayer insulating film covering the whole surface of the semiconductor substrate 1 containing the gate electrode 4. Therefore, this protecting multilayer insulating film is constructed as if the third protecting oxide film 14 was added under the second protecting nitride film 12 in the first embodiment. In this construction, similarly to the first embodiment, the fourth protecting oxide film 16 acts to relax the tensile stress of the third protecting nitride film 15 directly under the fourth protecting oxide film 16. However, it is not possible to eliminate influence of moisture on transistors contained in the third protecting oxide film 14 directly under the third protecting nitride film 15. On the other hand, the third protecting oxide film 14 can avoid the third protecting nitride film 15 from giving the stress directly to the gate oxide film 3 and the gate electrode 4.

The semiconductor device manufacturing method in accordance with the third embodiment of the present invention is the same as the process explained with reference to FIGS. 4A and 4B until the sidewall oxide film 7 is formed in the prior art semiconductor device manufacturing method. Therefore, explanation of the same process will be omitted, and further processing will be described with reference to FIG. 2A.

Figure 2A:
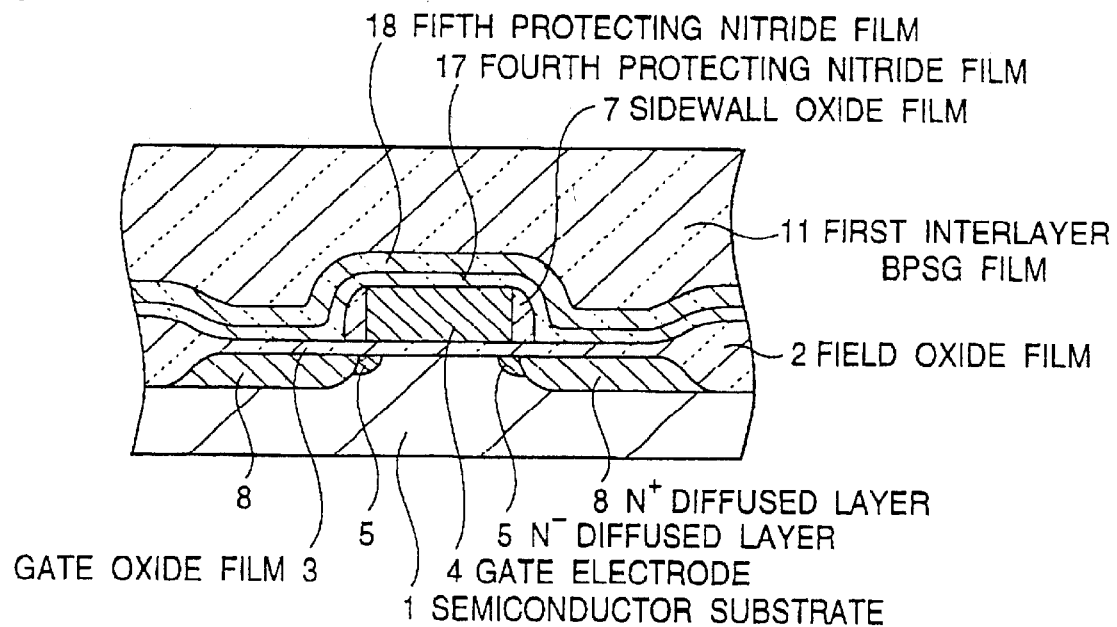
FIG. 2A is a diagrammatic sectional view of the semiconductor device for illustrating the semiconductor device and the semiconductor device manufacturing method in accordance with a third embodiment of the present invention.

After a principal portion of the LDD structure MOSFET having the sidewall oxide film 7 formed on the side wall of the gate electrode is completed as shown in FIG. 4B, in order to protect this LDD structure MOSFET from contamination by various materials formed thereon, as shown in FIG. 2A, a fourth protecting silicon nitride film 17 having a thickness of 10 nm to 20 nm is formed on the whole surface of the semiconductor substrate 1 including the gate electrode 4, by a thermal CVD process with a raw gas of $SiH_2Cl_2$ and $NH_3$, a substrate temperature of about 700° C. and a gas pressure of about 1 Torr. Then, a fifth protecting silicon nitride film 18 having a thickness of 30 nm to 100 nm is formed on the whole surface of the semiconductor substrate 1 including the fourth protecting silicon nitride film 17, by a plasma CVD process with a raw gas of $SiH_4$, $NH_3$ and Ar under the condition that a substrate temperature. is 250° C. to 300° C., a gas pressure is about 1 Torr, a RF power is not less than 300W, and a RF frequency is 13.56 MHz. Thereafter, a process similar to the first embodiment is conducted, and multilevel interconnection structure having the LDD structure MOSFET is completed.

In this third embodiment of the present invention, as mentioned above, the fourth protecting nitride film 17 and the fifth protecting nitride film 18 are stacked in the named order to form a protecting multilayer insulating film covering the whole surface of the semiconductor substrate 1 containing the gate electrode 4. The fourth protecting nitride film 17 is formed with the same film thickness and under the same condition as those in the first and second embodiments. On the other hand, the fifth protecting nitride film 18 is formed to have the thickness of 30 nm to 100 nm, by the plasma CVD process with the raw gas of $SiH_4$, $NH_3$ and Ar under the condition that the substrate temperature is 250° C. to 300° C., the gas pressure is about 1 Torr, the RF power is not less than 300W, and the RF frequency is 13.56 MHz.

Figure 3:
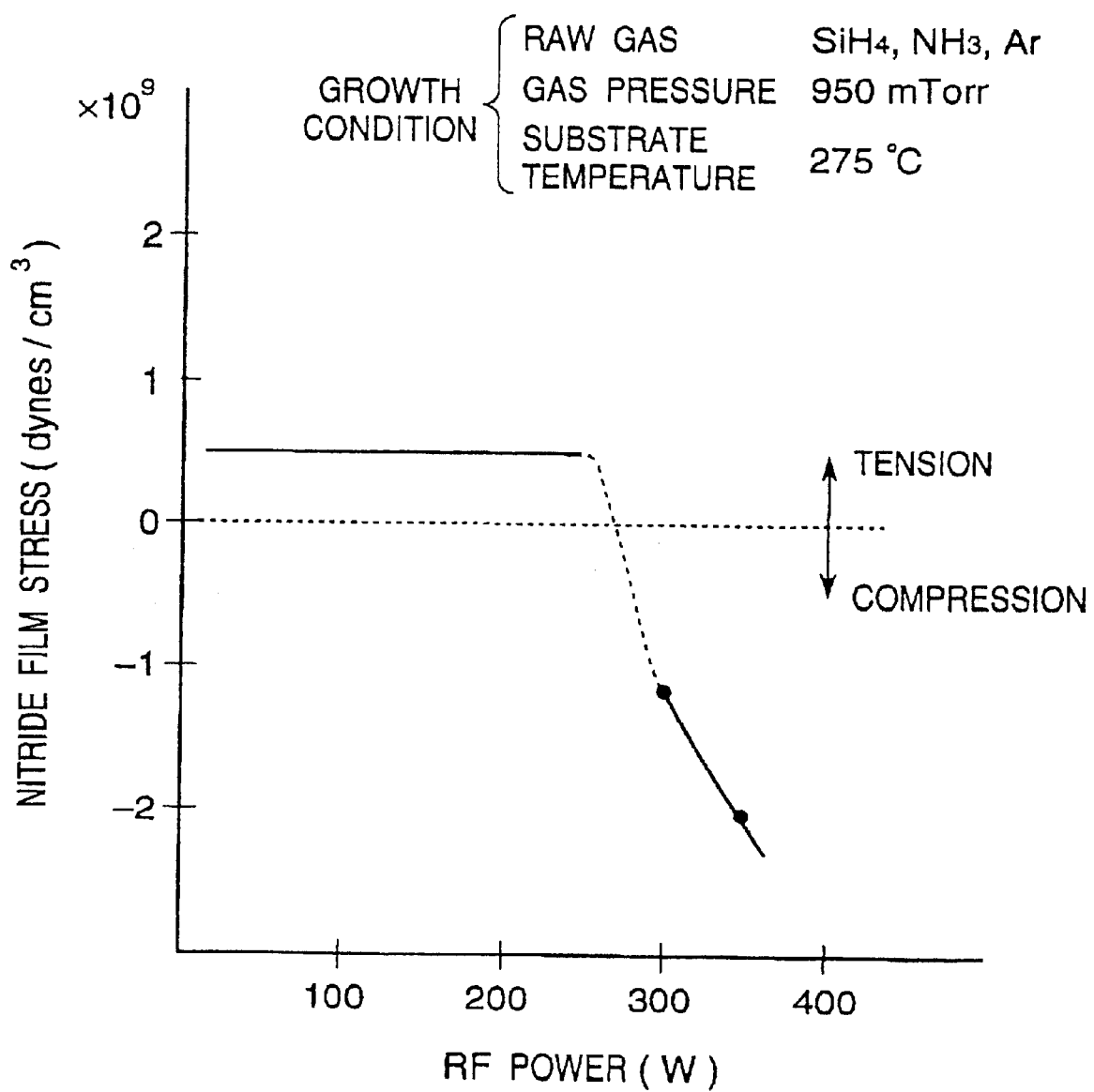
FIG. 3 is a graph illustrating how the stress of an uppermost protecting nitride film in a protecting multilayer insulating film changes dependent upon a RF power, in the semiconductor device and the semiconductor device manufacturing method in accordance with the third and fourth embodiments of the present invention.

Here, the situation of the stress of the fifth protecting nitride film 18 when the RF power is changed, is shown in FIG. 3. This characteristic is disclosed on page 601 of J. Electrochemical Society, 125, 1978 by A. K. Sinha et al. Under the condition that the raw gas is of $SiH_4$, $NH_3$ and Ar, the substrate temperature is 275° C., the gas pressure is 950 mTorr, if the RF power is changed, the film remarkably exhibits the compressive stress when the RF power is not less than 300W. For example, if the RF power is changed from 300W to 350W, the compressive stress changes from $1.0 \times 10^9$ dynes/cm$^3$ to $2.0 \times 10^9$ dynes/cm$^3$. Therefore, it would be understood that it is possible to easily control the compressive stress by the RF power.

Since the fourth protecting nitride film 17 formed by the thermal CVD process has the tensile stress of about $1.0 \times 10^{10}$ dynes/cm$^3$, in order to relax this tensile stress to about a half, it is sufficient if the film thickness of the fifth protecting nitride film 18 is set to be three times to five times the film thickness of the fourth protecting nitride film 17. Thus, the tensile stress of the fourth protecting nitride film 17 can be relaxed.

The semiconductor device manufacturing method in accordance with the second embodiment of the present invention is the same as the process explained with reference to FIGS. 4A and 4B until the sidewall oxide film 7 is formed in the prior art semiconductor device manufacturing method. Therefore, explanation of the same process will be omitted, and further processing will be described with reference to FIG. 2B.

Figure 2B:
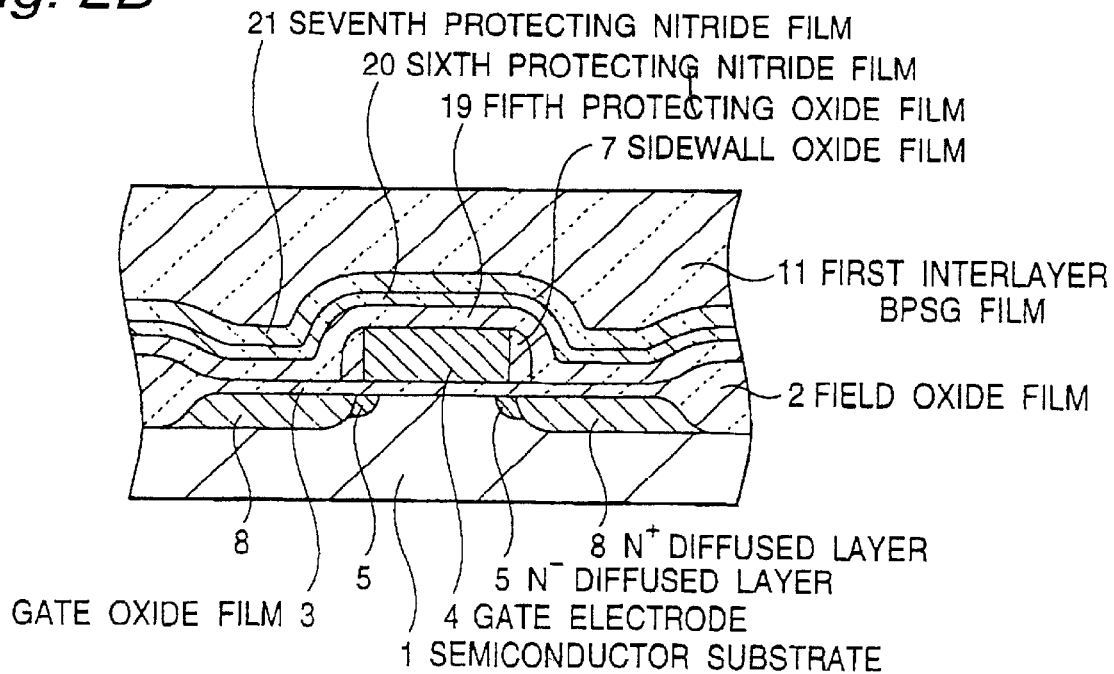
FIG. 2B is a diagrammatic sectional view of the semiconductor device for illustrating the semiconductor device and the semiconductor device manufacturing method in accordance with a fourth embodiment of the present invention.

After a principal portion of the LDD structure MOSFET having the sidewall oxide film 7 formed on the side wall of the gate electrode is completed as shown in FIG. 4B, in order to protect this LDD structure MOSFET from contamination by various materials formed thereon, as shown in FIG. 2B, a fifth protecting silicon oxide film 19 having a thickness of about 100 nm is formed on the whole surface of the semiconductor substrate 1 including the gate electrode 4, by an atmospheric pressure CVD process with a raw gas of $SiH_4$ and $O_2$ and a substrate temperature of about 400° C., and furthermore, a sixth protecting silicon nitride film 20 having a thickness of 10 nm to 20 nm is formed by a thermal CVD process with a raw gas of $SiH_4Cl_2$ and $NH_3$, a substrate temperature of about 700° C. and a gas pressure of about 1 Torr. Then, a seventh protecting silicon nitride film 21 having a thickness of 30 nm to 100 nm is formed on the whole surface of the semiconductor substrate 1 including the sixth protecting silicon nitride film 20, by a plasma CVD process with a raw gas of $SiH_4$, $NH_3$ and Ar under the condition that a substrate temperature is 250° C. to 300° C., a gas pressure is about 1 Torr, a RF power is not less than 300W, and a RF frequency is 13.56 MHz. Thereafter, a process similar to the first embodiment is conducted, and multilevel interconnection structure having the LDD structure MOSFET is completed.

In this fourth embodiment of the present invention, as mentioned above, the fifth protecting oxide film 19, the sixth protecting nitride film 20 and the seventh protecting nitride film 21 are stacked in the named order to form a protecting multilayer insulating film covering the whole surface of the semiconductor substrate 1 containing the gate electrode 4. Therefore, this protecting multilayer insulating film has a construction as if the fifth protecting oxide film 19 was added under the fourth protecting nitride film 17 in the third embodiment. In this construction, similarly to the third embodiment, the seventh protecting nitride film 21 acts to relax the tensile stress of the sixth protecting nitride film 20 directly under the seventh protecting nitride film 21. However, it is not possible to eliminate influence on transistors by moisture contained in the fifth protecting oxide film 19 directly under the sixth protecting nitride film 20. On the other hand, the fifth protecting oxide film 19 can avoid the sixth protecting nitride film 20 from giving the stress directly to the gate oxide film 3 and the gate electrode 4.

In the above mentioned first to fourth embodiments, before a first protecting nitride film included in the protecting multilayer insulating film (namely, the second protecting nitride film 12, the third protecting nitride film 15, the fourth protecting nitride film 17 and the sixth protecting nitride film 20) is deposited, if a heat treatment is conducted for ten seconds or more in a film depositing machine for depositing the first protecting nitride film, under the condition that the substrate temperature is not less than 700° C. and the gas pressure is not greater than $10^{-3}$ Torr, it is possible to eliminate the moisture contained in the gate oxide film 3, the third oxide film 14 and the fifth oxide film 19, respectively, with the result that the influence on transistors by moisture remaining in the oxide film can be eliminated. In particular, this is more advantageous in the second and fourth embodiments, in which the protecting oxide film is previously formed under the protecting nitride film.

As seen from the above, the present invention has the following advantages: As a protecting insulating film formed to cover the whole surface of the semiconductor substrate including the gate electrode, the protecting nitride film for presents infiltration of moisture from an interlayer insulator film(s) provided at an upper level(s) in the multilevel interconnection structure, and is deposited directly on the gate electrode or through the protecting oxide film on the gate electrode. This protecting oxide film presents the protecting nitride film from directly stressing the gate oxide film under the gate electrode and the boundary between the semiconductor substrate under the gate electrode and the gate oxide film. The protecting nitride film formed above the gate electrode has a large tensile stress, but this tensile stress is relaxed by forming a protecting oxide film or another protecting nitride film on the protecting nitride film formed above the gate electrode, so that it is possible to minimize the density of carrier trapping energy levels occurring within the gate oxide film under the gate electrode and at the boundary between the semiconductor substrate under the gate electrode and the gate oxide film.

Furthermore, before a first protecting nitride film included in the protecting multilayer insulating film is deposited, if a heat treatment is conducted for ten seconds or more in a depositing machine for depositing the first protecting nitride film, under the condition that the substrate temperature is not less than 700° C. and the gas pressure is not greater than $10^{-3}$ Torr, it is possible to eliminate the moisture contained in the gate oxide film or the protecting oxide film under the protecting nitride film, with the result that the influence on transistors by moisture remaining in the oxide film can be eliminated.

Thus, according to the manufacturing method of the present invention, it is possible to prevent the influence of moisture from the interlayer insulator film included in the multilevel interconnection structure on transistors. In addition, it is also possible to minimize the density of carrier trapping energy levels occurring within the gate oxide film under the gate eletrode, and at the boundary between the semiconductor substrate under the gate electrode and the gate oxide film, which cause instability in the threshold voltage of the transistor. Accordingly, a reliable and stable LDD structure MOSFET can be obtained.

The invention has thus been shown and described with reference to the specific embodiments. However, it should be noted that the present invention is in no way limited to the details of the illustrated structures, but changes and modifications may be made within the scope of the appended claims.

What is claimed is:

1. A method for manufacturing a semiconductor device, comprising the steps of:

forming a first insulator film on a semiconductor substrate of a first conductivity type to define a device region;

forming a gate insulator film on said semiconductor substrate within said device region;

forming a gate electrode on said gate insulator film within said device region;

forming a source region and a drain region of a second conductivity type opposite to said first conductivity type in said semiconductor substrate within said device region in self-alignment by using said gate electrode as a mask;

forming a sidewall insulator film on a side wall of said gate electrode;

forming a source lead-out region and a drain lead-out region of said second conductivity type in said semiconductor substrate within said device region in self-alignment by using said sidewall insulator film and said gate electrode as a mask;

forming a protecting insulating film having at least one insulator film on the whole surface of said semiconductor substrate including said gate electrode and said sidewall insulator film; and forming an interlayer insulator film on the whole surface of said semiconductor substrate including said protecting insulating film for isolating said gate electrode from a metal interconnection formed on said interlayer insulator film, wherein the step of forming said protecting insulating film includes the steps of depositing a first oxide film having a thickness of 90 nm to 110 nm on the whole surface of said semiconductor substrate including said gate electrode and said sidewall insulator film by an atmospheric pressure chemical vapor deposition process, succeedingly depositing a nitride film having a thickness of 10 nm to 20 nm by a thermal chemical vapor deposition process, and thereafter, depositing a second oxide film having a thickness of 40 nm to 60 nm by a plasma chemical vapor deposition process.

2. A method for manufacturing a semiconductor device claimed in claim 1 wherein said thermal chemical vapor deposition is conducted at a temperature of 700° C., said atmospheric pressure chemical vapor deposition process is conducted at a temperature of 400° C., and said plasma chemical vapor deposition process is conducted at a temperature range of 250° C. to 300° C.

3. A method for manufacturing a semiconductor device claimed in claim 1 wherein before said first nitride film having the thickness of 10 nm to 20 nm is deposited by the thermal chemical vapor deposition process, said semiconductor substrate is heat-treated in a deposition machine for depositing said first nitride film, for not less than ten seconds at a temperature of not less than 700° C. and a gas pressure of not greater than $10^{-3}$ Torr.

4. A method for manufacturing a semiconductor device, comprising the steps of:

forming a first insulator film on a semiconductor substrate of a first conductivity type to define a device region;

forming a gate insulator film on said semiconductor substrate within said device region;

forming a gate electrode on said gate insulator film within said device region;

forming a source region and a drain region of a second conductivity type opposite to said first conductivity type in said semiconductor substrate within said device region in self-alignment by using said gate electrode as a mask;

forming a sidewall insulator film on a side wall of said gate electrode;

forming a source lead-out region and a drain lead-out region of said second conductivity type in said semiconductor substrate within said device region in self-alignment by using said sidewall insulator film and said gate electrode as a mask;

forming a protecting insulating film having at least one insulator film on the whole surface of said semiconductor substrate including said gate electrode and said sidewall insulator film; and forming an interlayer insulator film on the whole surface of said semiconductor substrate including said protecting insulating film for isolating said gate electrode from a metal interconnection formed on said interlayer insulator film, wherein the step of forming said protecting insulating film includes the steps of depositing a first nitride film having a thickness of 10 nm to 20 nm by a thermal chemical vapor deposition process, and succeedingly depositing a second nitride film having a thickness of 30 nm to 100 nm by a plasma chemical vapor deposition process.

5. A method for manufacturing a semiconductor device claimed in claim 4 wherein said thermal chemical vapor deposition is conducted at a temperature of 700° C., and said plasma chemical vapor deposition process is conducted at a temperature range of 250° C. to 300° C.

6. A method for manufacturing a semiconductor device claimed in claim 4 wherein before said first nitride film having the thickness of 10 nm to 20 nm is deposited by the thermal chemical vapor deposition process, said semiconductor substrate is heat-treated in a deposition machine for depositing said first nitride film, for not less than ten seconds at a temperature of not less than 700° C. and a gas pressure of not greater than $10^{-3}$ Torr.

7. A method for manufacturing a semiconductor device, comprising the steps of:

forming a first insulator film on a semiconductor substrate of a first conductivity type to define a device region;

forming a gate insulator film on said semiconductor substrate within said device region;

forming a gate electrode on said gate insulator film within said device region;

forming a source region and a drain region of a second conductivity type opposite to said first conductivity type in said semiconductor substrate within said device region in self-alignment by using said gate electrode as a mask;

forming a sidewall insulator film on a side wall of said gate electrode;

forming a source lead-out region and a drain lead-out region of said second conductivity type in said semiconductor substrate within said device region in self-alignment by using said sidewall insulator film and said gate electrode as a mask;

forming a protecting insulating film having at least one insulator film on the whole surface of said semiconductor substrate including said gate electrode and said sidewall insulator film; and forming an interlayer insulator film on the whole surface of said semiconductor substrate including said protecting insulating film for isolating said gate electrode from a metal interconnection formed on said interlayer insulator film, wherein the steps of forming said protecting insulating film includes the step of depositing an oxide film having a thickness of 90 nm to 110 nm on the whole surface of said semiconductor substrate including said gate electrode and said sidewall insulator film by an atmospheric pressure chemical vapor deposition process, succeedingly depositing a first nitride film having a thickness of 10 nm to 20 nm by a thermal chemical vapor deposition process, and thereafter, depositing a second nitride film having a thickness of 30 nm to 100 nm by a plasma chemical vapor deposition process.

8. A method for manufacturing a semiconductor device claimed in claim 7 wherein said thermal chemical vapor deposition is conducted at a temperature of 700° C., said atmospheric pressure chemical vapor deposition process is conducted at a temperature of 400° C., and said plasma chemical vapor deposition process is conducted at a temperature range of 250° C. to 300° C.

9. A method for manufacturing a semiconductor device claimed in claim 7 wherein before said first nitride film having the thickness of 10 nm to 20 nm is deposited by the thermal chemical vapor deposition process, said semiconductor substrate is heat-treated in a deposition machine for depositing said first nitride film, for not less than ten seconds at a temperature of not less than 700° C. and a gas pressure of not greater than $10^{-3}$ Torr.

\* \* \* \* \*